United States Patent
Rastegar et al.

(10) Patent No.: US 8,206,510 B2
(45) Date of Patent: Jun. 26, 2012

(54) METHOD AND APPARATUS FOR AN IN-SITU ULTRAVIOLET CLEANING TOOL

(75) Inventors: Abbas Rastegar, Schenectady, NY (US); Yoshiaki Ikuta, Schenectady, NY (US)

(73) Assignee: Sematech, Inc., Austin, TX (US)

(*) Notice: Subject to any disclaimer, the term of this patent is extended or adjusted under 35 U.S.C. 154(b) by 0 days.

(21) Appl. No.: 13/027,923

(22) Filed: Feb. 15, 2011

(65) Prior Publication Data

US 2011/0132394 A1 Jun. 9, 2011

Related U.S. Application Data

(62) Division of application No. 11/301,643, filed on Dec. 13, 2005, now Pat. No. 7,921,859.

(60) Provisional application No. 60/636,829, filed on Dec. 16, 2004.

(51) Int. Cl.
  *B08B 3/10* (2006.01)
(52) U.S. Cl. .................. 134/1.3; 134/1; 134/33; 134/34
(58) Field of Classification Search .................. None
  See application file for complete search history.

(56) References Cited

U.S. PATENT DOCUMENTS

| | | | |
|---|---|---|---|
| 5,669,979 A | 9/1997 | Elliott et al. | 134/1 |
| 5,814,156 A | 9/1998 | Elliott et al. | 134/1 |
| 6,009,888 A | 1/2000 | Ye et al. | 134/1.3 |
| 6,127,279 A | 10/2000 | Konuma | 438/745 |
| 6,690,072 B2 | 2/2004 | Cabral, Jr. et al. | 257/382 |
| 6,830,628 B2 | 12/2004 | Bergman | 134/3 |
| 6,843,857 B2 | 1/2005 | Bergman | 134/28 |
| 6,848,455 B1 | 2/2005 | Shrinivasan et al. | 134/1.3 |
| 6,960,327 B2 | 11/2005 | Navrotsky et al. | 423/130 |

FOREIGN PATENT DOCUMENTS

| | | |
|---|---|---|
| JP | 56-132326 | 10/1981 |
| JP | 1-111337 | 4/1989 |
| JP | 1-297186 | 11/1989 |
| JP | 5-47730 | 2/1993 |
| JP | 8-318181 | 12/1996 |
| JP | 9-199458 | 7/1997 |
| JP | 2002-192089 | 7/2002 |
| JP | 2003-047842 | 2/2003 |
| JP | 2003-309098 | * 10/2003 |
| JP | 2004-193455 | 7/2004 |

(Continued)

OTHER PUBLICATIONS

Computer translation of JP 2003-309098 by Endo et al., published Oct. 31, 2003.*

(Continued)

*Primary Examiner* — Michael Kornakov
*Assistant Examiner* — Ryan Coleman
(74) *Attorney, Agent, or Firm* — Fulbright & Jaworski L.L.P.

(57) ABSTRACT

The present invention provides an apparatus and a method for an ultraviolet cleaning tool. The cleaning tool includes ultraviolet source spaced apart from a surface having contaminant particles. The ultraviolet source can create ozone between the surface and the ultraviolet source which breaks the chemical bonds between particles and the surface. The apparatus includes a gas feed which introduces a gas to aid the chemical bond. Additionally, the gas feed can introduce a gas to remove the particles from the surface.

17 Claims, 3 Drawing Sheets

FOREIGN PATENT DOCUMENTS

KR   102004102323   12/2004

OTHER PUBLICATIONS

Japanese Office Action, issued in Japanese Patent Application No. 2005-363934, mailed Jul. 6, 2010.
Definition of "Couple"; 10$^{th}$ edition of Merriam Webster's Collegiate Dictionary, published 1999.
Definition of "Couple"; Cambridge Dictionaries online, accessed on Feb. 6, 2010.
Office Action issued in U.S. Appl. No. 11/301,643, dated May 23, 2008.
Office Action issued in U.S. Appl. No. 11/301,643, dated Jul. 29, 2008.
Office Action issued in U.S. Appl. No. 11/301,643, dated Apr. 27, 2009.
Office Action issued in U.S. Appl. No. 11/301,643, dated Oct. 14, 2009.
Office Action issued in U.S. Appl. No. 11/301,643, dated Jun. 4, 2010.
Notice of Allowance issued in U.S. Appl. No. 11/301,643, dated Dec. 8, 2010.

* cited by examiner

METHOD AND APPARATUS FOR AN IN-SITU ULTRAVIOLET CLEANING TOOL

CROSS REFERENCE TO RELATED APPLICATION

This application is a divisional of U.S. application Ser. No. 11/301,643 filed Dec. 13, 2005, now issued as U.S. Pat. No. 7,921,859, which claims priority to U.S. Provisional Patent Application No. 60/636,829, filed Dec. 16, 2004. The entire text of each of the above-referenced disclosures is specifically incorporated by reference herein without disclaimer.

BACKGROUND OF THE INVENTION

1. Field of the Invention

The present invention relates generally to semiconductor fabrication processes, and more particularly to an apparatus and method for removing particles from surfaces, including, without limitation, silicon wafers, photomask substrates, photomask blanks, and the like.

2. Description of Related Art

Removal of sub-100 nanometer (nm) particles from a surface can be a challenging subject for semiconductor fabrication processes. These particles may include contaminants on the surface including materials such as organic material, dust, residue, and metal impurities. Generally, the particles accumulate when the substrate is being stored or is in a stand-by state between successive processes and may cause defects, particularly for integrated circuits on a substrate.

The surface-particle interactions depend on the material and the surface structure. As such, the energy transfer efficiency needed to remove a particle from a surface strongly depends on the size of the particle on the surface. Generally, adhesive forces between the particle and the surface need to be broken and the particle needs to be transported far enough away from the surface such that the particle will not be redeposited on the surface.

Current methods for removing particles include wet cleaning techniques that involve immersing a substrate in a series of chemical solutions or spraying a series of chemical solutions onto a substrate, including for example, hydrofluoric acid, hydrogen peroxide solution, sulfuric acid, etc. In some techniques, a spin brush and/or a megasonic cleaner may be included. However, these processes are both expensive and produce waste that is environmentally harmful. Additionally, the use of a spin brush or an megasonic cleaner can be effective in removing large particles, but are not effective in removing particles on the order of submicrons or smaller.

Additionally, Next Generation Lithography (NGL) used in semiconductor technology includes reflective optics on glass substrates which have a surface roughness of approximately 1.5 Angstrom RMS or less to prevent scattering of the light, which may degrade the lithography process performance. Generally, all particles larger than about 27 nanometers need to be removed from the surface of a mask substrate that is used for NGL. The conventional wet cleaning techniques that use under etching of particles to remove particles from the surface are no longer applicable as they increase the surface roughness beyond the required value. In addition, most of the current advanced cleaning tools do not have the ability to remove the total particles with size of 27 nm and larger from the surface of the plates. This is due lack of a mechanism that be able to convey relatively high energy or momentum in distances of few nanometers from the surface. Additionally, current tools lack a mechanism to increase the population of reactive species in the vicinity of interface. Most of the chemical reactions are diffusion processes which drive the reactive species toward the surface.

The referenced shortcomings are not intended to be exhaustive, but rather are among many that tend to impair the effectiveness of previously known techniques concerning particle removal; however, those mentioned here are sufficient to demonstrate that the methodologies appearing in the art have not been satisfactory and that a significant need exists for the techniques described and claimed in this disclosure.

SUMMARY OF THE INVENTION

The present invention involves removing contaminant particles on a surface, including, without limitation, silicon wafers (patterned and unpatterned), glass wafers (patterned and unpatterned), glass substrates, photomask substrates, masks, and the like, which may be a result of residues on the surface. In one embodiment, a mechanism of energy transfer may be used to break the chemical bonds between the contaminant particles and the surface. For example, an ultraviolet (UV) process may be used to disassociate the chemical bonds between the contaminant particles and the surface and also to create ozone. The ozone is an active component which may react with the contaminant particles and decompose them. Further, the present invention involves methods and apparatuses that may deliver ozone and/or other active oxygen radicals to the surface and directly to particle to dissolve it.

In one respect, a method for removing particles on a surface is provided. The method includes a step of providing a liquid onto the surface including the particles to create a confined liquid layer. In some embodiments, the step of providing the liquid occurs substantially simultaneous with the step of irradiating the liquid layer on the surface with an ultraviolet light source to create ozone and other oxygen radicals to break bonds between the particles on the surface of the plate. Upon the disassociation of the bonds, the particles are removed from the plate.

In some respects, the UV light source may be used to modify a surface condition from hydrophobic to hydrophilic. This condition change may activate a surface to enhance chemical reactions needed to remove particles.

In other respects, a cleaning tool is provided. The cleaning tool includes a chuck for receiving a surface comprising particles, an ultraviolet light source spaced apart from the surface, and a moving arm spaced apart from the surface, the moving arm simultaneously providing an ultraviolet light and a liquid for creating an ozone to remove the particles.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DESCRIPTION OF ILLUSTRATIVE EMBODIMENTS

The invention and the various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only and not by way of limitation. Various substitutions, modifications, additions, and/or rearrangements within the spirit and/or scope of the underlying inventive concept will become apparent to those skilled in the art from this disclosure.

The present disclosure provides techniques for substantially removing particles having a dimension less than or equal to about 100 nanometers, including, without limitation, dust, organic materials, metal impurities, from a surface. Additionally, the present disclosure provides techniques for removing particles with a dimension of about 100 nanometers or greater. In one embodiment, an ultraviolet (UV) light source or a vacuum UV (VUV) light source may be provided for breaking the chemical bond between the surface and the particle. Additionally, the UV or VUV light source may create ozone and other reactive oxygen radicals, which may enhance the cleaning performance.

Figure 1B:
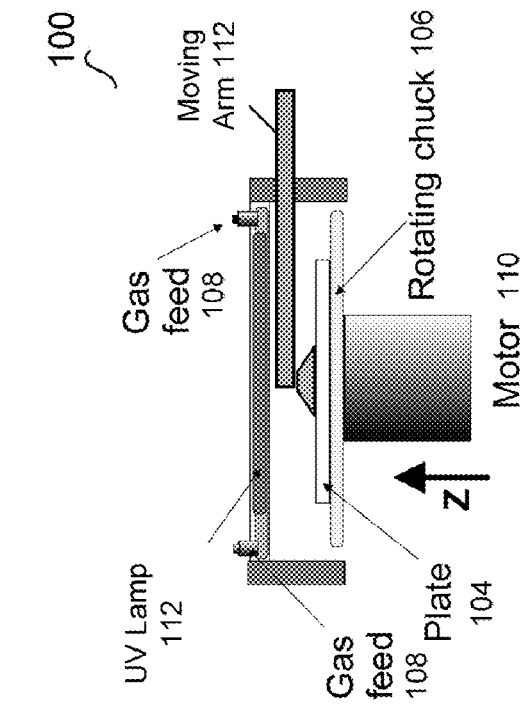
FIG. 1B is a side-view of the cleaning tool of FIG. 1A, in accordance with embodiments of the invention.
Figure 1A:
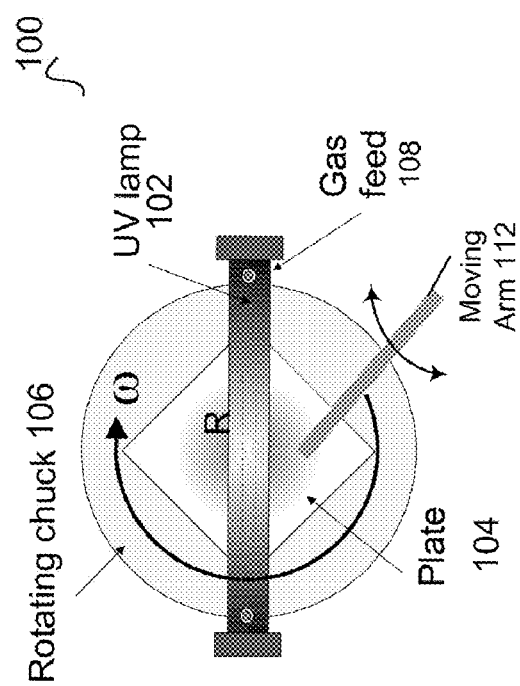
FIG. 1A is top-view of a cleaning tool, in accordance with embodiments of the invention.

FIGS. 1A and 1B, a top-view and side-view, respectively, of an in-situ UV cleaning tool 100 is shown. In one embodiment, the UV cleaning tool may include an UV source 102 located inside a process chamber (not shown) and may be placed over surface 104 and may be used during different processes inside the process chamber. The distance between surface 104 (e.g., a glass substrate, a glass surface, a silicon substrate, plate, photomask substrate, etc.) and UV source 102 may be controlled by either moving rotating chuck 106 using motor 110. Alternatively, the distance between surface 104 and UV source 102 may be controlled by moving UV source 102 in a vertical direction.

In one embodiment, UV source 102 may be a side-on lamp, a head-on lamp, a pen-shape long lamp, or an array of UV-point source and may operate with a wavelength of about 140 to 400 nanometers (nm) at an intensity of about 1 mW/cm2 or higher, preferably higher than 5 mW/cm2. Examples of UV source 102 may include, without limitation, high pressure mercury lamp (wavelength of about 250-450 nm), low pressure mercury lamp (wavelength of about 180-480 nm), UV light emitting and/or laser diode (wavelength of about 300-400 nm), metal halide lamp (wavelength of about 200-450 nm), Xe2 excimer lamp (wavelength of about 172 nm), Ar2 excimer lamp (wavelength of about 146 nm), KrCl excimer lamp (wavelength of about 222 nm), XeI excimer lamp (wavelength of about 254 nm), XeCl excimer lamp (wavelength of about 308 nm), ArF excimer laser (wavelength of about 193 nm), KrF excimer laser (wavelength of about 248 nm), F2 laser (wavelength of about 157 nm). Alternatively, the UV source may be provided by using frequency conversion crystals and a visible or infrared light.

Figure 2A:
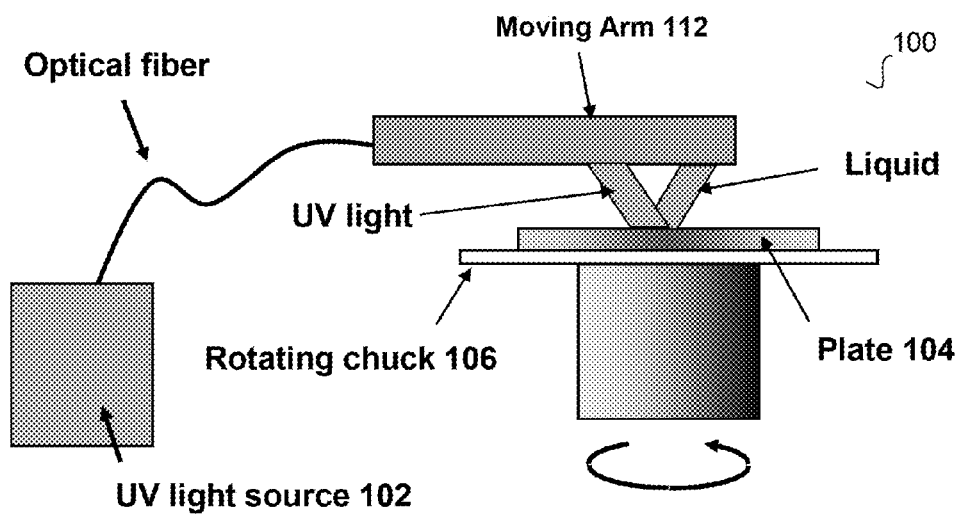
FIG. 2A is a side-view of a cleaning tool, in accordance with embodiments of the invention.
Figure 2B:
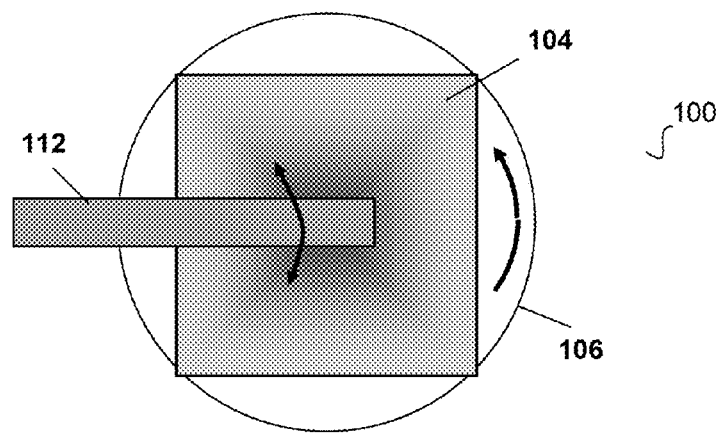
FIG. 2B is a top-view of the cleaning tool of FIG. 2A, in accordance with embodiments of the invention.

In other embodiments, UV source 102 may be located outside of the process chamber, where UV light 224, generating from UV source 102 may be introduced into a process chamber using, for example, optical fiber 222 as shown in FIGS. 2A and 2B. Alternatively, an optical wave guide, a lens, or a reflective mirror, may be used. The optical fiber, wave guide, lens, and/or reflective mirror may be embedded into moving arm 112, which swivels, rotates, and/or slides over surface 104. In these configurations, the window of UV light source or the reflecting mirror can be heated by using heater or peltier device (not shown) to prevent liquid condensation on the window or mirror surface.

The in-situ UV cleaning tool 100 of FIGS. 1A, 1B, 2A, and 2B may dispense liquid 228 onto the plate surface substantially simultaneously with the irradiation of UV light. The liquid may be sprayed onto a surface by using the moving (swivel) arm 112. Alternatively, the liquid may be dispensed using a beam nozzle. The liquid may include, without limitation, deionized water (DIW), ozonated water, hydrogen water, ammonium hydroxide, isopropanol alcohol, hydrofluoric acid, hydrogen peroxide solution, sulfuric acid, and/or any combinations of these solutions. In one embodiment, the swivel arm 112 may dispense ozonated water and/or hydrogen peroxide solution onto a surface needing to be cleaned substantially simultaneous with radiation of a UV light having the wavelength of about 250 to 260 nm. In this example, the combination of the UV light with a wavelength of 250~260 nm and the ozone molecule dissolved in water (e g., minimizing the exposure to an air interface) may generate highly reactive species, such as hydroxy radicals (OH*), super oxide ($O_2^-$), hydroxy peroxide ($HO_2$) and oxygen radicals ($O_2$*), to enhance the particle removal from the surface. Here, the flow rate of a solution to dispense onto the surface may be controlled to form a liquid film on the whole surface area of the plate. For example, the flow may range from about 10 milliliters per minute to about 2 liters per minute for substrates such as, without limitation, 6 square inch glass substrates. Surface 104, coupled to rotating chuck 106 and motor 110, may be rotated at about 1 to 3000 revolutions per minute (rpm) during the exposure of an UV light so as to distribute the liquid (e.g., ozoned liquid) uniformly to the surface of interest and to prevent from the re-deposition of removed particle onto the surface.

In other embodiments, a liquid may be dispensed through at least one acoustic modulator or piezoelectric based transducer coupled to moving arm 112 to fill the space between the UV light source and a plate surface. Transducer may oscillate with a frequency of about 100 Hz to 7 MHz such that an acoustic energy through a liquid beam may be delivered to the surface. The acoustic beam at the surface of plate may overlap the area exposed to the UV light. As such, the particle removal can be improved by using this acoustic energy by reducing the boundary layer and acoustic streaming.

Additionally, the in-situ UV cleaning tool 100 may introduce a gas, such as $N_2$, Ar or Xe, via gas feeds 108 (not shown in FIGS. 2A and 2B for brevity) into the space between the UV lamp 102 and surface 104 inside the process chamber. In one embodiment, the gas may be introduced a front side of UV source to prevent from contaminating the UV lamp 102 with water or chemical spills. For example, the chemicals may be sprayed on to the plate surface and may splash back onto the surface of UV source and absorb the UV light on the surface of the source instead of the interface of liquid and surface to be cleaned. Alternatively, the gas may be used for cooling of the UV source. In yet another embodiment, the gas may contain a reactive gas, such as $O_2$, water vapor, $CF_4$, and XeF, having a concentration of about 1 to 50 vol %, that may react with contaminants on the surface under the UV light irradiation or create some reactive species, such as OH radical, to react with the contaminants. The reactive gases may interact with the particles and may aid in the breaking of the chemical bond between the particles and the surface.

Figure 3:
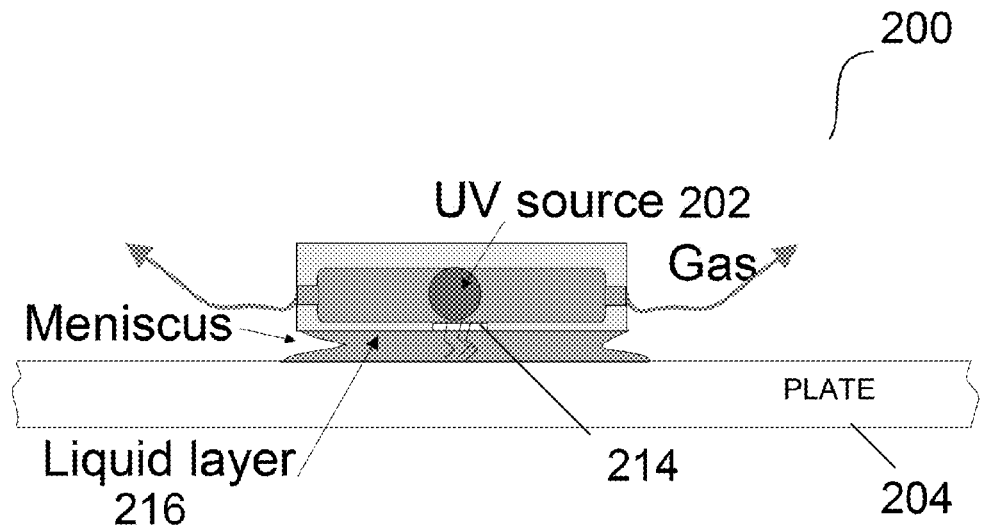
FIG. 3 is a cross-sectional view of the cleaning tool, in accordance with embodiments of the invention.

In other embodiments, a liquid may be dispensed to substantially fill the space between the UV light source and a plate surface. Referring to FIG. 3, a cross-sectional view of cleaning 200 including UV source 202 and a plate 204 with a liquid layer 216 on a surface of a plate 204 is shown. In one embodiment, UV light source 202 may be covered by a UV-transparent window 214 and a mirror that allows the UV light to pass through the window. The space surrounded by the window and the mirror may be purged with inert gas 326 such as, but not limited to, nitrogen ($N_2$), Helium (He), Argon (Ar), or Krypton (Kr) to prevent from losing the UV light intensity due to the absorption by air and moisture. When UV source 202 is situated close to the plate with a separation distance of about a few hundreds or thousands of microns, a confined liquid layer 216 may stay between plate 204 and UV source 202 due to capillary forces. As such, there may be substantially no liquid-to-air interface and ozone may form inside the liquid. Additionally, the UV source 202 may be controlled to a position to allow the confined liquid layer to remain between the UV source and the surface. This substantially prevents any ozone created within the liquid layer from diffusing into the gas phase because there is substantially no interface between the liquid and the gas, thus, the liquid is capable of dissolving a high concentration of ozone. Since the distance between the UV light source and the surface is minimal in this configuration, UV light with higher intensity may radiate the surface to create more ozone and other oxygen radicals within the liquid film. In this configuration, when aqueous solution such as de-ionized water and ammonia water may be exposed to the UV light with a wavelength shorter than 200 nm, ozone and some highly reactive species, such as hydroxy radicals (OH*), super oxide ($O_2^-$), hydroxy peroxide ($HO_2$) and oxygen radicals ($O_2$*), may be generated in the water layer and particles may be removed efficiently because of its high oxidation strengths enough to dissolve the organic material. As such, low pressure mercury lamp (wavelength of about 180-480 nm), ArF excimer laser (wavelength of about 193 nm), Xe2 excimer lamp (wavelength of about 172 nm), F2 laser (wavelength of about 157 nm) and Ar2 excimer lamp (wavelength of about 146 nm), and other UV sources may be used as a light source.

The cleaning tools of the present disclosure, shown in FIGS. 1A, 1B, 2A, 2B, and 3 may be integrated into existing wet cleaning tools (e.g., stripping tools, etching tools, etc.) for removing contaminant particles on both mask and wafers and other surfaces of interests, including, without limitation, plates used for liquid crystal display (LCD). Additionally, the in situ UV cleaning tool may be used during spin dry processes. The application of UV light source may change the condition of most surfaces of interest to hydrophilic that leads to a lower number of particles both in spin drying and surface-tension-gradient based drying processes in cleaning tools.

Figure 4:
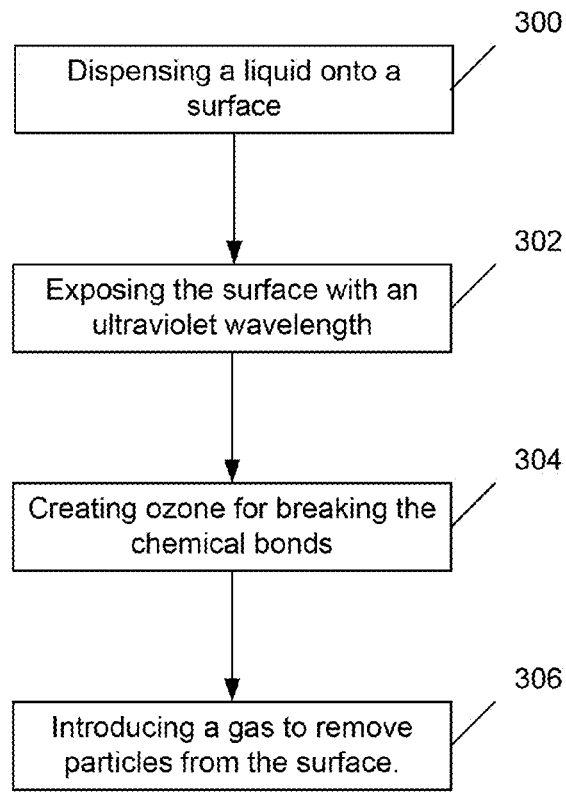
FIG. 4 is a flowchart of a method, in accordance with embodiments of the invention.

Referring to the flowchart of FIG. 4, a liquid (e.g., ozonated water) may be dispensed on the surface to form a liquid film with a thickness of about 200 to 300 micrometers to dissolve or oxidize the particles (step 300). Next, a UV light source (similar to UV light source 102 in FIGS. 1 and 2 or 202 in FIG. 3) may be brought into close proximity (e.g., about 200 micrometers) to the surface of interest to expose the surface (step 302). In some embodiments, step 302 may occur substantially simultaneous with step 300. Due to surface tension between the UV source window and the liquid layer and the tension between the liquid layer-substrate surface, a meniscus of liquid 216 may form and liquid will be trapped between two solid surface. Depending on the material of these surfaces and the nature of liquid used, the liquid layer thickness can be as large as about 1000 μm. As such, the UV source 102 may create ozone close to the surface of the plate (step 304). In one embodiment, the ozone may be at the interface between a liquid layer and the surface of plate. Therefore, a higher rate of chemical reactions at the interface may occur and thus, result in a substantially contaminant particle free surface. Additionally, the introduction of ozone and other oxygen radicals may dissociate chemical bonds more effectively to remove particles from a surface of the plate. In other embodiments, the UV source 102 may most of the surfaces of the plate to turn into hydrophilic surface which is known to lead to lower particles after drying. In step 306, a gas may be introduced. The gas may be used for cooling the UV source. Alternatively, the gas may be used to react with contamination on the surface and may aid in the breaking of the chemical bond between the particles and the surface.

The apparatuses and techniques of this disclosure may not be limited to ozonated water and may be applied together with other chemicals commonly used in wet cleaning of semiconductor industries. For example, ozonated water, hydrogen water, ammonia water, hydrogen peroxide solution, sulfuric acid, organic acid and the mixture of any these solutions may be used to enhance the particle removal capability. In some embodiments, UV light with a wavelength of about 140 to about 260 nm may be used. Alternatively, UV light with a wavelength of about 140 to about 200 nm may be preferred due to the efficient creation of ozone and excited radicals. For example, a Xe2 excimer lamp (wavelength of about 172 nm), mercury lamp (wavelength of about 180~450 nm), a F2 laser (wavelength of about 157 nm), or a Kr excimer lamp (wavelength of about 146 nm) and others may be used as examples of light source.

Additionally, excited oxygen radicals and ozone may be generated in deionized water with the substantially simultaneous irradiation of UV light with a wavelength of less than about 200 nm. Since they have high oxidation strengths enough to dissolve the organic material, the UV radiation onto the solutions listed above may enhance to remove particles from a surface of interest.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

What is claimed is:

1. A method for removing particles from a surface comprising:
    providing on a chuck a surface having particles thereon;
    applying a liquid onto the surface from a liquid source to form a confined liquid layer between the surface and an ultraviolet light source;
    irradiating the confined liquid layer on the surface with ultraviolet light; and removing the particles from the surface;
wherein the ultraviolet light source and the liquid source are coupled to an arm, and wherein the arm moves the ultraviolet light source and liquid source relative to the surface.

2. The method of claim 1, the applying step and the irradiating step being performed substantially simultaneously.

3. The method of claim 1, the liquid being selected from the group consisting of deionized water, ozonated water, hydrogen water, ammonia water, ammonium hydroxide, isopropanol alcohol, hydrofluoric acid, hydrogen peroxide solution, sulfuric acid, and any combinations of these liquids.

4. The method of claim 1, the step of irradiating the surface comprising irradiating the surface with an ultraviolet light with a wavelength between about 140 to about 400 nanometers.

5. The method of claim 1, the step of removing the particles comprising performing a dissolving process.

6. The method of claim 1, the step of removing the particles comprising performing a oxidizing process.

7. The method of claim 1, further comprising applying a gas to the liquid.

8. The method of claim 7, the gas being selected from the group consisting of $O_2$, water vapor, $CF_4$, XeF, $N_2$, Ar, and Xe.

9. The method of claim 1, the surface being selected from the group consisting of a silicon wafer, a glass wafer, a glass substrate, a photomask substrate, and a plate.

10. The method of claim 1, wherein the ultraviolet light source comprises a Light Emitting Diode (LED).

11. The method of claim 1, further comprising applying acoustic vibrations to the surface with an ultrasound transducer.

12. A method for removing particles from a surface comprising:
providing on a chuck a surface having particles thereon;
receiving a surface having particles thereon;
applying ultraviolet light to the surface with an ultraviolet light source, the ultraviolet light source being spaced apart from the surface; and
providing liquid between the surface and the ultraviolet light source substantially simultaneous with the application of ultraviolet light to the surface with a liquid source, the liquid forming a liquid layer in contact with the ultraviolet light source and with the surface during the application of ultraviolet light to the surface;
wherein the ultraviolet light source and the liquid source are coupled to an arm, and wherein the arm moves the ultraviolet light source and liquid source relative to the surface.

13. The method of claim 12, wherein the ultraviolet light source comprises a Light Emitting Diode (LED) coupled to the arm.

14. The method of claim 12, further comprising applying acoustic vibrations to the surface with an acoustic source positioned in proximity of the ultraviolet light source.

15. The method of claim 14, wherein the acoustic source comprises one or more transducers configured to emit acoustical energy at a frequency in the range of 100 Hz to 7 MHz.

16. The method of claim 12, further comprising applying gas to the liquid with a gas source.

17. The method of claim 12, further comprising increasing the hydrophilicity of the surface.

* * * * *